(12) United States Patent
Huber et al.

(10) Patent No.: US 6,691,521 B2
(45) Date of Patent: Feb. 17, 2004

(54) CRYOSTAT

(75) Inventors: Norbert Huber, Erlangen (DE); Rudolf Röckelein, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/300,926

(22) Filed: Nov. 21, 2002

(65) Prior Publication Data

US 2003/0115888 A1 Jun. 26, 2003

(30) Foreign Application Priority Data

Nov. 21, 2001 (DE) .......................... 101 57 080

(51) Int. Cl.[7] .............. F25B 19/00; F25D 3/10
(52) U.S. Cl. ........................................ 62/51.1
(58) Field of Search .......................... 62/51.1

(56) References Cited

U.S. PATENT DOCUMENTS

| | | | | |
|---|---|---|---|---|
| 3,696,636 A | * | 10/1972 | Mille ........................ | 62/399 |
| 4,291,541 A | | 9/1981 | Kneip, Jr. et al. | |
| 4,601,175 A | * | 7/1986 | Kneip et al. ............. | 62/50.2 |
| 4,756,167 A | * | 7/1988 | Kuriyama et al. ....... | 62/51.1 |
| RE33,878 E | * | 4/1992 | Bartlett et al. ........... | 62/47.1 |
| 5,201,184 A | * | 4/1993 | Roth ......................... | 62/47.1 |
| 5,319,154 A | * | 6/1994 | Kermarrec ................ | 174/15.5 |
| 5,598,710 A | * | 2/1997 | Tomeoku et al. ........ | 62/51.1 |

FOREIGN PATENT DOCUMENTS

| | | |
|---|---|---|
| DE | 3924579 A1 | 2/1990 |
| EP | 0 250 675 B1 | 10/1992 |
| EP | 0 642 641 B1 | 12/1996 |
| EP | 0 414 528 B1 | 6/1997 |
| EP | 0 587 423 B1 | 6/1999 |
| EP | 0 736 778 B1 | 7/1999 |
| JP | 03-251768 | * 11/1991 |

OTHER PUBLICATIONS

Patent Abstracts of Japan, Publication No. 07192898 A, Publication Date: Jul. 28, 1995.

* cited by examiner

Primary Examiner—William C. Doerrler
(74) Attorney, Agent, or Firm—Staas & Halsey LLP

(57) ABSTRACT

Cryostat having a connecting branch which is connected to a cooling chamber and is open on the end side, raised parts and/or depressions increasing the wall surface being provided on at least part of the inner wall of the connecting branch.

25 Claims, 3 Drawing Sheets

CRYOSTAT

CROSS REFERENCE TO RELATED APPLICATIONS

This application is based on and hereby claims priority to German Application No. 101 57 080.5 filed on Nov. 21, 2001, the contents of which are hereby incorporated by reference.

BACKGROUND OF THE INVENTION

The invention relates to a cryostat having a connecting branch which is connected to a cooling chamber and is open on the end side, for example according to DE 39 24 579 A1.

Cryostats of this type are known and are used wherever an object has to be cooled to a very low temperature. Liquid nitrogen having a temperature of 77 K or liquid helium having a temperature of 4.3 K are usually used as coolant, which is provided in a coolant chamber of the cryostat. A cryostat is used, for example, in a magnetic resonance investigation device primarily used for medical purposes (cf., for example, DE 39 24 579 A1, EP 0 587 423 B1 or EP 0 736 778 B1), or else in investigation devices for analytical purposes in the chemistry field (cf., for example, U.S. Pat. No. 4,291,541 A). When a cryostat is used in a magnetic resonance tomograph, the cryostat is used for cooling the superconductive magnet used for generating the basic field. The cryostat in question has an open connecting branch, i.e. it is an open system in which the coolant chamber containing the liquid coolant is connected to the environment. The liquid coolant does not rapidly volatilize via the open connecting branch because boiling equilibrium is set, and the supply of heat and energy to the coolant via the connecting branch is relatively small, so that very little coolant evaporates. Customary maintenance cycles within which coolant has to be topped up are approximately a year in the case of known magnetic resonance tomographs.

In the case of such a cryostat of a magnetic resonance tomograph, the connecting branch has a number of properties. Firstly, the first filling of the coolant chamber with coolant and topping up of the coolant can take place via the cryostat. Secondly, evaporating coolant can volatilize via the cryostat, the coolant having to volatilize in the case of an open system in order to avoid the internal pressure in the coolant chamber rising to an impermissibly high level. Moreover, the connecting branch is also used, if appropriate, for accommodating an electrode which is connected to the superconductive magnet when starting up the system. Via this electrode and a second electrode, which is likewise connected to the superconductive magnet, a current is guided over the superconductive magnet and, after reaching the transition temperature and with the magnet sufficiently cooled, is guided in a loss-free manner in the magnet, after which the two electrodes are separated from the superconductive magnet.

In this case, essentially three requirements have to be fulfilled by the connecting branch. Firstly, when accommodating an electrode it is to heat up as little as possible in order to avoid an impermissible high transport of heat taking place in the direction of the coolant chamber via the connecting branch or via the shield insulating the coolant chamber to the outside. Furthermore, small transport of heat from the environment into the interior of the cryostat during operation is to take place via the connecting branch. Finally, a pressure loss which is as small as possible has to be provided when volatilizing coolant flows through the connecting branch, for example in the event of a quench. In the case of a quench, the superconductive magnet becomes impermissibly hot at one point and transfers into the standard conductive state, which is associated with local heating which spreads and results, in the worst case, in the entire superconductive magnet transferring into the standard conductive state. Above all, the transport of heat into the interior of the cryostat via the connecting branch has a great effect on the duration of the maintenance cycle. The lower the heat input, the longer can the maintenance cycles be, which has a significant effect on the competitiveness of the product.

One aspect of the invention is therefore based on the problem of specifying a cryostat having a reduced heat input via the connecting branch.

SUMMARY OF THE INVENTION

In order to solve this problem, one aspect of the invention makes provision, in the case of a cryostat of the type mentioned at the beginning, for raised parts and/or depressions increasing the wall surface to be provided on at least part of the inner wall of the connecting branch.

One aspect of the invention is distinguished in that the wall surface of the connecting-branch inner wall is increased in a specific manner by raised parts and/or depressions. This is based on the finding that the heat input into the cryostat via the connecting branch is summarized as follows:

$$Q_{total} = Q_{radiation} + Q_{conduction} - \alpha \Delta T A, \text{ where:}$$

$Q_{total}$=total heat input
$Q_{radiation}$=heat input by heat radiation
$Q_{conduction}$=heat input by heat conduction
$\alpha$=heat transfer coefficient
$\Delta T$=temperature difference between inner wall temperature and temperature of the volatilizing coolant
$A$=surface of the inner wall As is apparent from the above equation, the heat radiation, which is passed into the cryostat through the connecting branch, and the heat conduction, which is input by the connecting branch or the connecting-branch material itself, increases the energy input. In contrast, it is reduced by the heat transfer from the wall to the discharge flow of the evaporating coolant. As described, the system is an open one in which some cooling medium evaporates, in albeit small quantities. The cooling medium brushes past the inner wall of the connecting branch and absorbs heat there, the quantity of heat absorbed being dependent on the heat transfer coefficient, the given temperature difference and the surface brushed over by outgoing coolant vapor.

One aspect of the invention takes this as the starting point by consciously enlarging the wall surface via the raised parts or depressions. The larger wall surface consequently increases the proportional quantity of heat which reduces the energy input and removed via the coolant discharge flow, with the result that, all in all, a reduction in the entire heat input and of the entire heat balance of the cryostat is produced.

If appropriate, at least one elongate, preferably centrally arranged component can extend in the axial direction in the space surrounded by the connecting branch. If this component is formed of metallic material, heat input into the interior of the cryostat can also take place via this component. Consequently, it is expedient if, in the case of a cryostat in which an elongate component preferably used as an electrode is provided in the connecting branch, raised parts and/or depressions increasing the outer wall surface are also provided on the outer wall of the component. This is because the coolant vapor also flows past this component and can thus absorb heat from this component and conduct it away to the outside.

The raised parts and/or depressions are expediently arranged running in the flow direction, so that, on the one hand, a flow profile which is as uniform and homogeneous as possible is produced, and, on the other hand, the pressure loss between the interior of the cryostat or the coolant chamber and the environment (if appropriate, also a discharge chamber), which adjoins the connecting branch, is as small as possible via the connecting branch.

The raised parts themselves can protrude in the form of ribs or plates from the wall surface. For example, these rib- or plate-like raised parts can be designed as narrow sheet metal sections which are arranged on the inner wall of the connecting branch. They are, expediently as is the connecting branch, made from stainless steel which inherently has low heat conduction at the extremely low temperatures.

It is particularly expedient if the raised parts are arranged at a distance from one another in the direction toward the coolant chamber. That is to say, the raised parts are, as it were, interrupted so as to avoid unintentionally increasing the heat conduction into the cryostat. If, for example, the abovementioned stainless steel sheet metal sections are used, then a plurality of short sheet metal sections can be arranged following one another and spaced apart from one another by a short distance in a symmetrical or asymmetrical distribution over the length of the connecting branch.

In addition to the described rib- or plate-like raised parts, for example in the form of sheet metal sections, it is, of course, also conceivable to produce the cavities and, resulting in between therefrom, the raised parts by corresponding grooves. Any type of texturing by removing material or joining on additional elements which lead to an increase in surface, is conceivable.

In addition to this described embodiment, in which specific texturing measures, by joining on elements or by specific removal of material, are thus used, an alternative makes provision for the wall surface to be rough or textured in order to produce the raised parts and/or depressions or further raised parts and/or depressions. This roughening or texturing can take place, for example, by specific etching of the surface or by the application of a coating having a surface which is rough, textured or enlarged in the manner of a relief. Of course, this measure may also be used in addition to the measures described at the beginning.

In addition to the cryostat itself, one aspect of the invention relates to a magnetic resonance device comprising a cryostat of the type described as part of this device.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
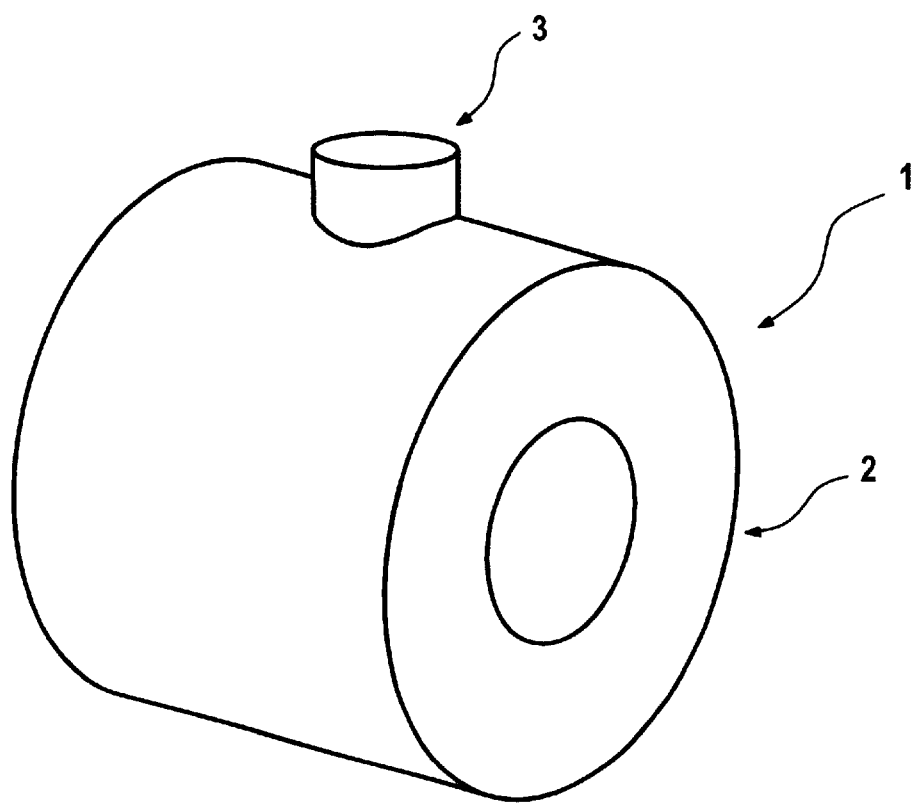
FIG. 1 shows, as a schematic diagram, a cutout from a magnetic resonance unit having a cryostat according to one aspect of the invention.

Reference will now be made in detail to the preferred embodiments of the present invention, examples of which are illustrated in the accompanying drawings, wherein like reference numerals refer to like elements throughout.

FIG. 1 shows a magnetic resonance device 1 in which the housing is not illustrated for reasons of clarity. A cryostat 2 has an outer wall 2a and an inner wall 2b. The cryostat 2 is shown which is already arranged around a superconductive basic field magnet of the magnetic resonance device 1. As can be seen, the inner wall 2b of the cryostat 2 completely surrounds the magnet and the other components, i.e. both on the wall surfaces and on the end sides. A tower 3 is provided in the upper region of the cryostat 2 and situated in this tower is a connecting branch which is described in more detail below and is connected to a coolant chamber of the cryostat 2, in which chamber a coolant, for example liquid nitrogen or, especially, liquid helium, is situated during operation. The connecting branch can thus be used to introduce this coolant into the coolant chamber and to top it off as the need arises.

Figure 2:
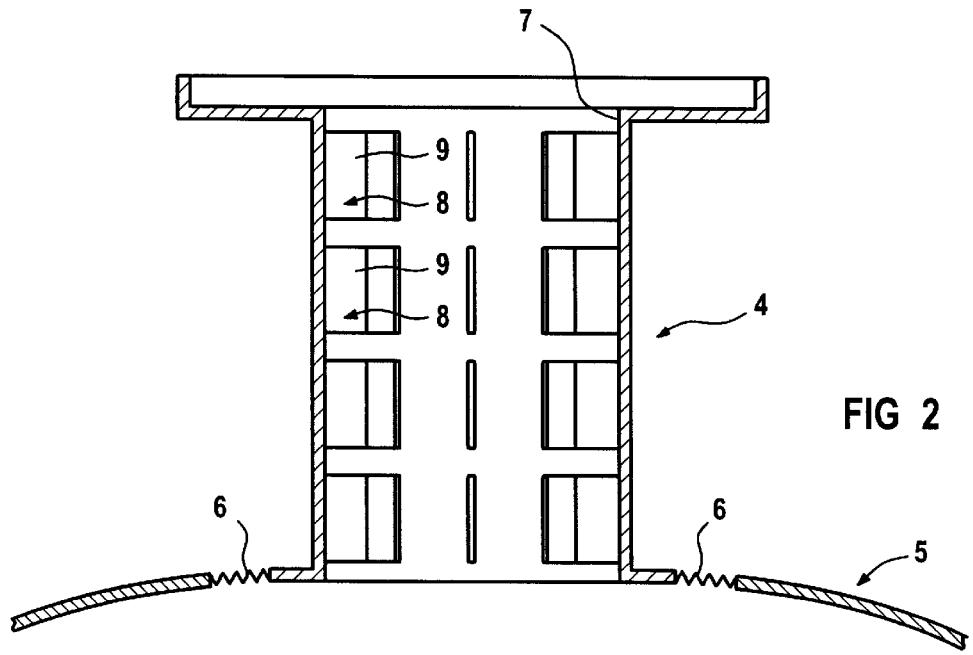
FIG. 2 shows an enlarged view of a first embodiment of the connecting branch of the cryostat from FIG. 1.

FIG. 2 shows a connecting branch 4 of a first embodiment in the form of a schematic diagram. The connecting branch 4 which is hollow-cylindrical in the exemplary embodiment shown—see FIG. 3—is connected to the wall 5 of the cryostat, the wall 5 merely being illustrated by way of example here, since its specific construction is somewhat irrelevant. As a rule, the wall 5 comprises a plurality of wall sections containing vacuum chambers and temperature shields in order to insulate the coolant chamber, which is situated in the interior, to the outside in the best possible manner. The connecting branch 4 is connected to the wall 5 via bellows-like expansion sections 6 which can compensate for a certain expansion in this region which may occur as a consequence of the conditions given here.

Figure 3:
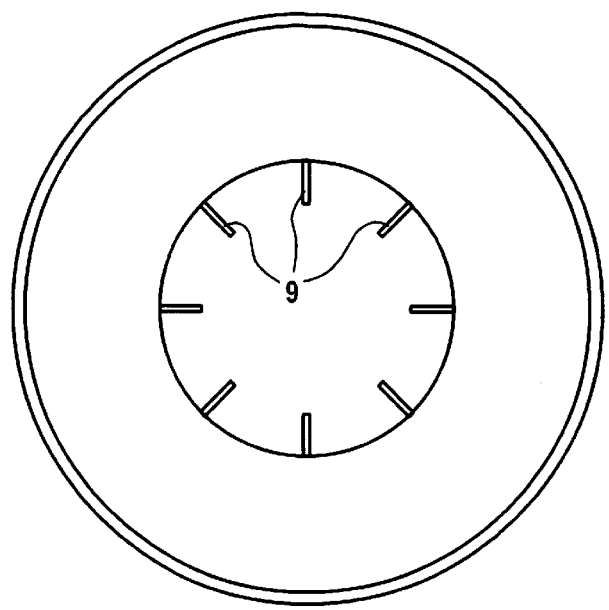
FIG. 3 shows a plan view of the connecting branch from FIG. 2.

As FIG. 2 shows, a plurality of inwardly projecting raised parts 8 in the form of narrow sheet metal sections 9, especially made of stainless steel, are provided on the inner wall 7 of the connecting branch 4, the raised parts being arranged symmetrically with respect to one another in the exemplary embodiment shown—see FIG. 3. The sheet metal sections 9 are arranged in such a manner that they lie in the flow direction, based on the coolant flow which, during operation, flows out of the coolant chamber through the connecting branch 4, so that they constitute a minimum flow resistance.

As FIG. 2 shows, the individual sheet metal sections 9 which are arranged one behind another are spaced apart from one another, so as to avoid heat being conducted from the outside into the interior of the cryostat via the individual sheet metal sections 9.

The sheet metal sections 9 result in a considerable increase in the wall surface of the inner wall 7. Since they are primarily of relatively thin-walled design, they very easily and rapidly take on the temperature of the adjacent wall section. If volatizing coolant, which, in the lower region, is still at the actual temperature cooled via the cryostat (77 K in the case of liquid nitrogen, 4.3 K in the case of liquid helium), now flows past the inner wall 7, then the coolant gas flow firstly brushes over the inner wall 7 itself and also over the sheet metal sections 9. At all points there, a heat transfer from the wall or the sheet metal sections to the coolant gas flow takes place. This heat is thus withdrawn from the connecting branch 4 and cannot enter into the interior of the cryostat. That is to say, in comparison with known arrangements, the overall quantity of heat input can be significantly reduced by increasing the surface. This applies both in normal operation and whenever the system is to be put into operation and the superconductor is to be started up. In this case, a current is guided via the connecting branch 4, which then acts as an electrode and is connected electrically to the superconductive magnet, the current flowing over the superconductor and being guided into it in a loss-free manner only when the transition temperature is reached along with sufficient cooling. During this period the connecting branch 4 can be greatly heated up. However, at the same time volatilizing coolant also flows here out of the coolant chamber through the connecting branch. It is clear that significant cooling can also take place here owing to the increase in surface, with the result that, all in all, lower heating of the connecting branch is produced. The greater the increase in the surface by the selected measures, the greater is the quantity of heat which can be removed in this manner.

Figure 4:
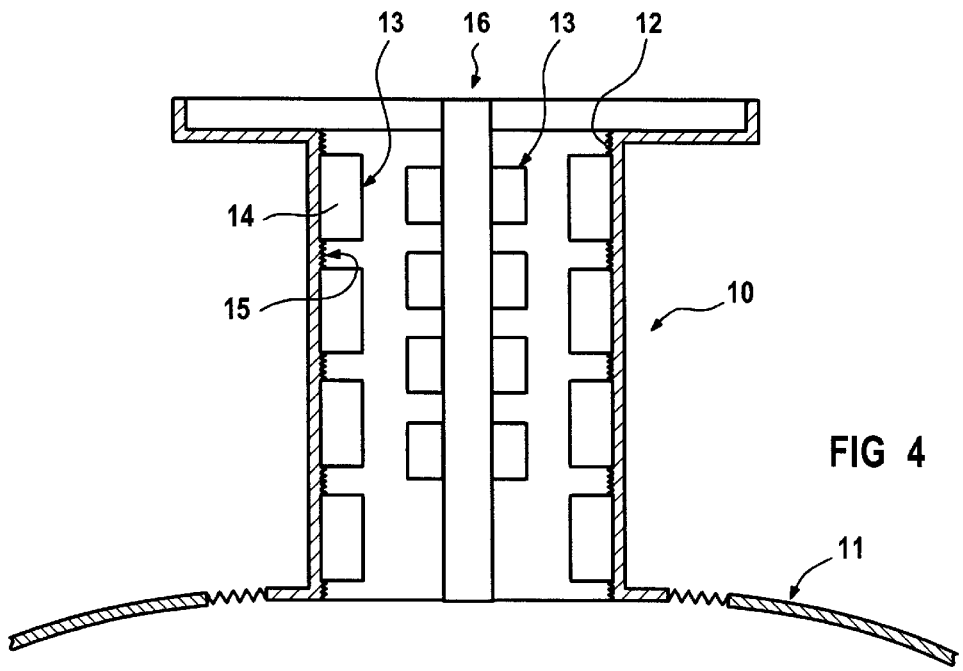
FIG. 4 shows a second embodiment of a connecting branch of a cryostat according to one aspect of the invention.

FIG. 4 shows a further embodiment of a connecting branch 10 which is connected to the wall 11 of the cryostat likewise in a manner not shown in greater detail. In addition to the raised parts 13 which are provided on the inner wall 12 of the connecting branch 10 and are in the form of rib- or plate-like sheet metal sections 14 which are arranged and distributed in the same manner as described with regard to the embodiments in FIGS. 2 and 3, the surface of the inner wall is additionally textured here and has a roughness as illustrated by the reference number 15. This roughness, which can be produced, for example by surface treatment of the inner wall 12, likewise increases the surface, so that the above-described effect can be further increased by the roughness.

An essentially rod-shaped component 16 is provided in the interior of the connecting branch, preferably concentrically therewith. Corresponding raised parts 13 in the form of the sheet metal sections 14 are also provided on this component, which likewise leads to the interior of the cryostat and in which heat can likewise be input, in particular via heat conduction, with the result that this surface is also significantly increased. Of course, there is also the possibility here of conferring a certain roughness on the surface of the component 16, although this is not illustrated in FIG. 4.

Figure 5:
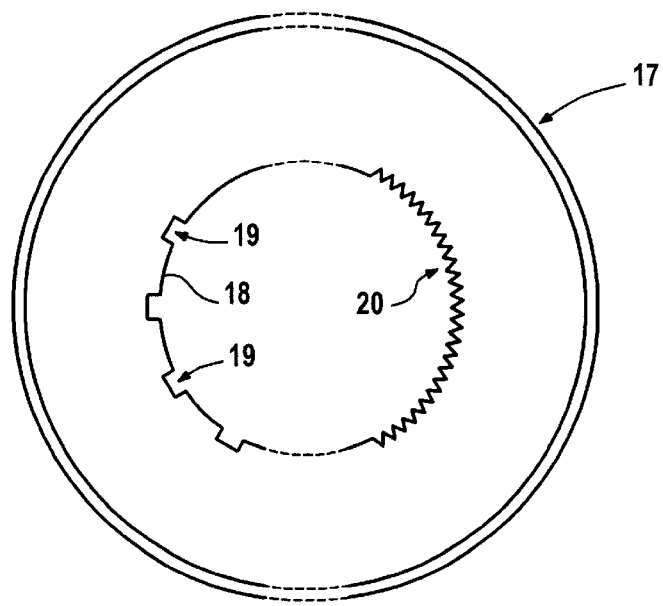
FIG. 5 shows a plan view of a connecting branch of a third embodiment.

Finally, FIG. 5 shows a schematic illustration in the form of plan view of a further connecting branch 17, the inner wall of which is provided, by way of example, with two different textures increasing the surface. In the left-hand half of the picture, the inner wall 18 is textured via channel- or groove-like cavities 19 which expediently likewise run in the flow direction. In the right-hand part of the picture, the inner wall 18 is profiled via a zigzag-shaped structure 20 with bumps and cavities, the latter expediently also running in the flow direction.

The invention has been described in detail with particular reference to preferred embodiments thereof and examples, but it will be understood that variations and modifications can be effected within the spirit and scope of the invention.

What is claimed is:

1. A cryostat, comprising:
a cooling chamber; and
a connecting branch connected to a cooling chamber and having an open end for filling the cooling chamber with coolant, the connection branch having an inner wall provided with at least one of raised parts and depressions, which increase surface area of the inner wall.

2. The cryostat as claimed in claim 1, further comprising an elongate component provided within a center of the connecting branch, the elongate component having an outer wall provided with at least one of raised parts and depressions, which increase surface area of the outer wall.

3. The cryostat as claimed in claim 1, wherein
the connecting branch accommodates fluid flow therein in a flow direction, and
at least one of the raised parts and the depressions are arranged to run parallel to the flow direction.

4. The cryostat as claimed in claim 1, wherein
raised parts are provided in the connecting branch, and
the raised parts are in the form ribs or plates protruding from the inner wall of the connecting branch.

5. The cryostat as claimed in claim 1, wherein
depressions are provided in the connecting branch, and
the depressions are in the form of grooves or channels in the inner wall of the connecting branch.

6. The cryostat as claimed in claim 4, wherein the rib- or plate-like raised parts are narrow sheet metal sections.

7. The cryostat as claimed in claim 6, wherein the sheet metal sections are made from stainless steel.

8. The cryostat as claimed in claim 7, wherein connecting branch is formed of stainless steel.

9. The cryostat as claimed in claim 4, wherein
the connecting branch accommodates fluid flow therein in a flow direction, and
a plurality of raised parts are spaced apart from one another in the flow direction.

10. The cryostat as claimed in claim 4, wherein
a plurality of raised parts are spaced apart from one another in an axial direction of the connecting branch.

11. The cryostat as claimed in claim 4, wherein
raised part sections are provided around a perimeter of the inner wall of the connecting branch, and
each raised part section comprises a plurality of raised parts spaced apart from one another in an axial direction of the connecting branch.

12. The cryostat as claimed in claim 1, wherein the inner wall of the connection branch is provided with raised parts and depressions.

13. The cryostat as claimed in claim 1, wherein the inner wall of the connection branch is provided with raised parts and not depressions.

14. The cryostat as claimed in claim 1, wherein the inner wall of the connection branch is provided with depressions and not raised parts.

15. The cryostat as claimed in claim 1, wherein the inner wall of the connecting branch has a surface which is roughened or textured in order to produce the raised parts or depressions.

16. The cryostat as claimed in claim 1, wherein the cooling chamber has casing to at least partially enclose a magnet of a magnetic resonance device.

17. The cryostat as claimed in claim 2, wherein
the connecting branch accommodates fluid flow therein in a flow direction, and
at least one of the raised parts and the depressions are arranged to run parallel to the flow direction.

18. The cryostat as claimed in claim 17, wherein raised parts are provided in the connecting branch, and the raised parts are in the form ribs or plates protruding from the inner wall of the connecting branch.

19. The cryostat as claimed in claim 17, wherein depressions are provided in the connecting branch, and the depressions are in the form of grooves or channels in the inner wall of the connecting branch.

20. The cryostat as claimed in claim 18, wherein the rib- or plate-like raised parts are narrow sheet metal sections.

21. The cryostat as claimed in claim 20, wherein the sheet metal sections are made from stainless steel.

22. The cryostat as claimed in claim 21, wherein connecting branch is formed of stainless steel.

23. The cryostat as claimed in claim 22, wherein raised part sections are provided around a perimeter of the inner wall of the connecting branch, and each raised part section comprises a plurality of raised parts spaced apart from one another in an axial direction of the connecting branch.

24. The cryostat as claimed in claim 23, wherein the inner wall of the connecting branch has a surface which is roughened or textured in order to produce the raised parts or depressions.

25. The cryostat as claimed in claim 24, wherein the cooling chamber has casing to at least partially enclose a magnet of a magnetic resonance device.

* * * * *